United States Patent
Sheard et al.

(10) Patent No.: US 11,248,910 B2
(45) Date of Patent: Feb. 15, 2022

(54) SIGNAL PROCESSING

(71) Applicant: Atlantic Inertial Systems Limited, Plymouth (GB)

(72) Inventors: John Keith Sheard, Plymouth (GB); Matthew Williamson, Plymouth (GB)

(73) Assignee: ATLANTIC INERTIAL SYSTEMS LIMITED, Plymouth (GB)

( * ) Notice: Subject to any disclaimer, the term of this patent is extended or adjusted under 35 U.S.C. 154(b) by 93 days.

(21) Appl. No.: 16/713,427

(22) Filed: Dec. 13, 2019

(65) Prior Publication Data
US 2021/0033399 A1    Feb. 4, 2021

(30) Foreign Application Priority Data
Aug. 2, 2019 (GB) .................................. 1911104

(51) Int. Cl.
G01C 19/5776 (2012.01)
G01C 19/5684 (2012.01)
H03D 3/00 (2006.01)

(52) U.S. Cl.
CPC ..... G01C 19/5776 (2013.01); G01C 19/5684 (2013.01); H03D 3/009 (2013.01)

(58) Field of Classification Search
CPC ............ G01C 19/5776; G01C 19/5684; G01C 19/5755; G01C 19/5726
See application file for complete search history.

(56) References Cited

U.S. PATENT DOCUMENTS

| | | | |
|---|---|---|---|
| 5,361,036 A | 11/1994 | White | |
| 5,757,862 A * | 5/1998 | Ishizu | ................. H04L 27/2331 329/304 |
| 5,932,804 A | 8/1999 | Hopkin et al. | |

(Continued)

FOREIGN PATENT DOCUMENTS

| | | |
|---|---|---|
| EP | 3249357 A1 | 11/2017 |
| GB | 2322196 A | 2/1997 |
| KR | 101414289 B1 | 7/2014 |

OTHER PUBLICATIONS

European Search Report for Application No. 19215044.9, dated Jul. 10, 2020, 8 pages.

(Continued)

*Primary Examiner* — Helen C Kwok
(74) *Attorney, Agent, or Firm* — Cantor Colburn LLP

(57) ABSTRACT

A method of demodulating a MEMS sensor pickoff signal from a vibrating resonator of said sensor, the method comprising: sampling the pickoff signal with an asynchronous ADC at a sampling rate of at least 50 times the resonant frequency of the resonator to generate a stream of samples; generating a first value by combining samples from said stream of samples according to a selected operation, said operation being selected in dependence on a synchronous clock signal that is synchronous to the resonant frequency of the resonator, said synchronous clock signal having a frequency at least twice the resonant frequency of the resonator; and counting the number of samples contributing to the first value. The increased sampling rate of the pickoff signal allows a much higher number of samples to be taken into account, thereby reducing noise. However, the ADC asynchronously from the resonator of the MEMS sensor.

19 Claims, 7 Drawing Sheets

(56) References Cited

U.S. PATENT DOCUMENTS

| | | | |
|---|---|---|---|
| 6,282,958 B1 | 9/2001 | Fell et al. | |
| 7,509,830 B2 * | 3/2009 | Mayer-Wegelin | G01C 19/56 |
| | | | 702/96 |
| 2004/0088127 A1 * | 5/2004 | M'Closkey | G01C 19/56 |
| | | | 702/96 |
| 2007/0103691 A1 | 5/2007 | Greening et al. | |
| 2016/0028280 A1 | 1/2016 | Townsend | |
| 2016/0028380 A1 * | 1/2016 | Townsend | H03M 1/12 |
| | | | 327/172 |
| 2016/0282116 A1 * | 9/2016 | Haneda | G01C 19/5649 |
| 2017/0328712 A1 * | 11/2017 | Collin | H03D 7/00 |

OTHER PUBLICATIONS

Search Report from IPO for Application No. GB1911104.6. dated Feb. 3, 2020; Search Received Feb. 10, 2020; 4 pages.

* cited by examiner

SIGNAL PROCESSING

FOREIGN PRIORITY

This application claims priority to European Patent Application No. 1911104.6 filed Aug. 2, 2019, the entire contents of which is incorporated herein by reference.

TECHNICAL FIELD

The present disclosure relates to signal processing for demodulation of the real and quadrature parts of the pickoff signal from a MEMS gyroscope, particularly from a vibratory ring type gyroscope.

BACKGROUND

Vibrating structure gyroscopes and other sensors may be fabricated using micro-electro-mechanical-systems (MEMS) technology from a semiconductor e.g. silicon substrate. MEMS manufacturing processes are often used to make small mechanical structures at low cost (relative to traditional manufacturing methods). There is considerable interest in utilising MEMS gyroscopes in a range of guidance, navigation and platform stabilisation applications due to their low cost, small size and inherently robust nature. MEMS gyroscopes operate using a mechanical structure excited and controlled by electronic systems. These sensing structures generally vibrate at a carrier frequency $F_c$ in the region of 14 KHz. As MEMS structures are generally very small, the signals of interest are also generally very small, and low noise circuitry and signal processing is required to recover the information with sufficient fidelity. Vibratory ring structure gyroscopes can be designed using different technologies, for example inductive, capacitive and piezoelectric versions exist (i.e. where the forces applied to the ring and the signals detected from the ring are created/detected using inductive, capacitive or piezoelectric electrodes). Both open loop and closed loop systems can be used. In open loop systems the signal is directly measured from the pickoff electrodes. In closed loop systems, the secondary (Coriolis-induced) motion is nulled by secondary drive electrodes and the magnitude of this secondary drive is used as the system output.

Some examples of vibrating structure gyroscopes may be found in GB 2322196, U.S. Pat. Nos. 5,932,804 and 6,282,958.

FIG. 1 shows a block diagram of a MEMS gyroscope and its associated circuitry. An annular mechanical resonator 1 is vibrated at its resonant frequency (typically 14 kHz) by the primary drive electrode $P_D$. Resonance is maintained by sensing the amplitude of vibration with primary pickoff electrode $P_P$. The signal from primary pickoff electrode $P_P$ is amplified by primary pickoff amplifier 2 and is used to drive a voltage controlled oscillator/phase locked loop (VCO/PLL) module 3 which locks onto the resonant frequency. The VCO/PLL module 3 is then used to drive the primary drive electrode $P_D$ to maintain the resonance of the resonator 1. The amplitude of the primary drive signal is also controlled via automatic gain control (AGC) module 4 which controls primary drive amplifier 5. The frequency of the VCO/PLL module 3 (labelled FRQ in FIG. 1) is output from the VCO/PLL module 3 and provided to the secondary processing loop as a reference clock synchronised with the resonator 1.

The annular resonator 1 is typically excited into a cos 2θ resonance mode. For a perfectly symmetrical resonator, this mode actually exists as a degenerate pair of primary and secondary vibration modes at a mutual angle of 45 degrees. The primary mode is excited as the carrier mode by the drive signal. When the annular resonator is rotated about an axis normal to its plane, the Coriolis effect causes a secondary vibration in an orthogonal direction that pulls energy into the secondary mode. The amplitude of motion of the secondary mode is proportional to the applied angular velocity and measured by a pickoff signal.

In such a Coriolis-type gyroscope, a quadrature bias may arise due to an imperfect matching of the primary and secondary frequencies in the cos 2θ vibration mode pair. The quadrature bias represents a significant error which appears as a large carrier frequency but at 90 degrees phase (phase quadrature) to the expected mechanical vibration. This quadrature bias signal can be several orders of magnitude larger than the pickoff signals of real interest. A processing system for the pick off signals must therefore have a large dynamic range, good linearity and very good phase accuracy to enable an accurate discrimination of the in-phase and quadrature components.

The secondary processing loop in FIG. 1 comprises a secondary pickoff electrode $S_P$ arranged to measure the amplitude of the secondary mode of oscillation of the resonator 1. The magnitude of this oscillation is proportional to the rotation rate about the sensing axis. As discussed above, in an ideal system the secondary pickoff signal would contain only the rate signal. However, in a real system manufacturing imperfections mean that there is a mismatch between the resonant frequencies of the drive mode and the sense mode of vibration of the resonator. This frequency mismatch gives rise to the quadrature signal on top of the desired rate signal. The signal from the secondary pickoff electrode therefore contains two components; a real part and a quadrature part, the quadrature part being 90 degrees out of phase with the real part. The real part of the signal is the part that is proportional to the rotation rate. To extract this rate signal, the signal from the secondary pickoff electrode $S_P$ is demodulated by the demodulation module 6. The demodulation module 6 contains an amplifier 7 and separates out the real signal 8 from the quadrature signal 9. The real signal 8 is then output via a further amplifier 10 as the output of the gyroscope.

In the example of FIG. 1, the gyroscope is a closed loop gyroscope in which the secondary mode vibrations are nulled by a secondary drive electrode $S_D$. The secondary drive electrode $S_D$ is driven by the recombined real and quadrature signals (combined at 11), and amplified by secondary drive amplifier 12.

The secondary pickoff signal may be represented as:

$$V_{SP} = R \cos \omega t + Q \sin \omega t + b$$

Where:
R is the real (in phase) amplitude,
Q is the quadrature amplitude ($\pi/2$ out of phase),
$\omega/2\pi$ is the resonant frequency,
t is time, and
b is a voltage offset.

In addition to these components of the signal, there is also noise, e.g. electromagnetic noise from the measurement circuit.

The objective of the demodulation module 6 is to measure the real component, R and the quadrature component Q whilst rejecting noise as much as possible. One current implementation is shown in FIG. 2. The output of the secondary pickoff amplifier 7 is digitized by an analogue to digital converter (ADC) 13. The ADC 13 is driven by the sample clock 14 which is synchronised with the resonator 1 so that it samples at four times the resonant frequency of the resonator 1, sampling specifically at time points ωt=π/4, 3π/4, 5π/4, 7π/4 (for example the sample clock 14 may be obtained from the FRQ signal shown in FIG. 1). As the ADC 13 is synchronised to the resonator 1, it is known that the samples correspond to specific points in the resonator's oscillation. Within one cycle of oscillation, these four samples (S1-S4 in FIG. 2) can be taken to correspond to four corresponding quadrants, Q1-Q4. In FIG. 2, in the first quadrant, Q1 (in which sample S1 is taken), the real part of the signal is positive and the quadrature part is also positive. In the second quadrant, Q2 (in which sample S2 is taken), the real part is negative while the quadrature part is positive. In the third quadrant, Q3 (in which sample S3 is taken), the real part is negative and the quadrature part is also negative. In the fourth quadrant, Q4 (in which the sample S4 is taken), the real part is positive and the quadrature part is negative. This is summarised in the following table:

TABLE 1

|  | S1 | S2 | S3 | S4 |
|---|---|---|---|---|
| Real | + | − | − | + |
| Quadrature | + | + | − | − |

S1 is taken at ωt=π/4, S2 at ωt=3π/4, S3 at ωt=5π/4 and S4 at ωt=7π/4 (although in FIG. 2, S3 and S4 are represented for convenience at corresponding points on the negative side of the time axis, i.e. at −3π/4 and −π/4 respectively). Thus, by combining the four samples from the ADC in an appropriate manner, the real and quadrature components can be added or cancelled as desired. Thus:

Real=S1−S2−S3+S4

Quad=S1+S2−S3−S4

In the first summation, the Real parts of the samples add up while the Quadrature parts cancel out. In the second summation, the Quadrature parts of the samples add up while the Real parts cancel out. Thus the Real and Quadrature components of the secondary pickoff signal are demodulated. It will be appreciated that this process only works because the sample clock is synchronous to the resonator 1 so that the samples are taken at known points in the resonance cycle so that they can be added and subtracted correctly.

The processing of the samples S1-S4 is performed in the SPO demodulator 16 which performs the above calculations. The samples S1-S4 may be temporarily stored in storage unit 17 disposed between the ADC 13 and the SPO demodulator 16. The storage unit 17 provides enough storage (in the form of registers or memory for example) to hold the data from ADC 13 until the SPO demodulator 16 is ready to use it.

SUMMARY

There is disclosed herein a method of demodulating a MEMS sensor pickoff signal from a vibrating resonator of said sensor, the method comprising: sampling the pickoff signal with an asynchronous ADC at a sampling rate of at least 50 times the resonant frequency of the resonator to generate a stream of samples; generating a first value by combining samples from said stream of samples according to a selected operation, said operation being selected in dependence on a synchronous clock signal that is synchronous to the resonant frequency of the resonator, said synchronous clock signal having a frequency at least twice the resonant frequency of the resonator; and counting the number of samples contributing to the first value.

One of the downsides of existing methods of extracting the real and/or quadrature components from the pickoff signal is the amount of noise in the signal and hence the signal to noise ratio in the output signal. The level of the pickoff signal itself can be very low (e.g. a few millivolts) and hence the level of noise can be a big problem with getting a suitably sensitive signal from the sensor. Averaging over more samples is a good way to reduce noise, but this either requires taking more time to collect the data or increasing the sampling rate. Collecting data over a longer time period reduces the time-resolution of the system output (e.g. fewer readings per second) and is also limited by the fact that the data is changing over time, so collecting data over a longer time smooths the output undesirably. However, simply increasing the sampling rate is also problematic as it is difficult to generate fast clocks that are synchronous to the resonator. There are already difficulties in maintaining sufficiently accurate synchronisation at a sampling rate of four times the resonator frequency for typical MEMS sensors (i.e. with typical resonator frequencies in the range of 10-20 kHz). To accurately demodulate the real and quadrature components of the pickoff signal at a rate of four samples per second, those samples need to be very accurately spaced and timed over the resonator cycle so that when they are appropriately combined together (as described below), the real or quadrature component of each sample can be accurately cancelled out, thereby obtaining accurate measurements of the Real and Quad signals.

According to the methods of this disclosure, the sampling rate of the pickoff signal is increased so that a much higher number of samples can be taken into account, thereby reducing noise. However, in the method according to this disclosure, the ADC is not driven by a synchronous clock. Instead, the ADC operates asynchronously, i.e. not in synchrony with the resonator of the MEMS sensor. This allows a much faster clock to be used and therefore a much higher sampling rate, but it introduces a problem that the timing of each sample is not tied to a particular point in the resonator cycle. To address that problem, a lower frequency synchronous clock is used (i.e. synchronous with the resonator of the MEMS sensor) to keep track of which samples fell within particular sectors of the resonator cycle (e.g. sectors defined by adjacent triggers of the synchronous clock). This information can then be used to select an appropriate way to combine the samples. Therefore the methods of this disclosure recognise the fact that faster asynchronous samples can be taken providing that the operation that combines them is still dependent on a slower synchronous clock. This allows a large gain in signal to noise ratio to be achieved with only minor hardware updates, e.g. a faster asynchronous ADC.

The selected operation may be selected from: i) adding the sample to the first value, ii) ignoring the sample, and iii) subtracting the sample from the first value. As the pickoff signal moves through a complete cycle, the real and quadrature components of that signal (which are 90 degrees out of phase with each other) go through a series of quadrants in which they are either both positive, both negative or one positive, one negative (as described in the table above). By selecting appropriate sectors of the pickoff signal where one component (e.g. the quadrature component) averages to zero while the other component (e.g. the real component) averages to a non-zero value, the two components can be separated, i.e. demodulated. Such sectors can be identified by the synchronous clock signal operating at a frequency of at least twice the resonant frequency of the resonator.

For example, with the synchronous clock providing triggers at $\pi/2$ and $3\pi/2$ radians within the resonator cycle, aligned with the zero-crossings of the real component of the signal, the resonator cycle is divided into two sectors, one in which the real signal is positive (and in which the quadrature signal is symmetrical and averages to zero) and the other in which the real signal is negative (and in which the quadrature signal is symmetrical and averages to zero). By adding together all the (positive) samples from the first sector and subtracting all the (negative) samples from the second sector, the total value will be representative of an average value of the real component, with the quadrature component having been cancelled out. The value is 'representative' of the average value as it will include a scaling factor that depends on the shape of the signal (a sinusoid) and the number of samples taken over the whole cycle (i.e. the number of samples that contributed to the value). Note that the change of operation only happens twice per cycle, at the triggers of the synchronous clock, i.e. changing from addition to subtraction at $\pi/2$ radians and switching back from subtraction to addition at $3\pi/2$ radians. The samples that are taken in between these points are taken asynchronously, but the number of those samples is counted so that the end value can be appropriately scaled.

The samples may be stored in a memory and retained for later processing. In such cases, each sample could be stored alongside a value representing the currently selected operation, i.e. the current period of the synchronous clock so as to retain the association between each sample and its relevant sector of the resonator cycle. In some examples the samples may be stored in a storage block, e.g. a memory or an array of registers or the like until needed, whereupon they can be accessed and processed. However, storage of all samples in memory requires the provision of a significant quantity of memory and requires more complicated logic to access the memory and perform the appropriate combination operations at a later time. There may be some benefits to this, but an alternative and simpler set up is to process each sample as it is generated, i.e. to combine each new sample with a current running total for the value according to the currently selected operation (e.g. addition, subtraction, or no action), after which the current sample can simply be discarded. Thus memory is only required for the current sample, the current running total and the count of the number of samples taken into account. With such a method, the generated value may be output once per cycle after a full cycle of samples has been combined. The stored values (running total of value and number of samples taken into account) can then be reset so that the process starts over and repeats for the next resonator cycle.

While a synchronous clock signal of twice the resonant frequency of the resonator is sufficient for the above operation, in some examples the synchronous clock signal has a frequency at least four times the resonant frequency of the resonator. This allows a finer division of the resonator cycle into sectors and is consistent with certain existing hardware which currently operates at four times the resonant frequency as was discussed above. Therefore minimal modification is required to upgrade existing designs to the new improved designs of this disclosure. An additional benefit of defining more sectors within the cycle is that the system can be used to extract both the real and quadrature components of the signal simultaneously.

For example, with the four quadrant arrangement defined above in table 1, the real component can be extracted by adding samples S1 and S4 from Q1 and Q4 (addition of quadrature components in S1 and S4 cancels them out) while subtracting samples S2 and S3 from Q2 and Q3 (again cancelling the quadrature). At the same time, the quadrature component can be extracted by adding samples S1 and S2 from Q1 and Q2 (addition of real components in S1 and S2 cancels them out) while subtracting samples S3 and S4 from Q3 and Q4 (again cancelling the real). Thus, with a synchronous clock operating at four times the resonant frequency, four sectors can be defined between the clock triggers at $\pi/4$, $3\pi/4$, $5\pi/4$ and $7\pi/4$, and both the real and quadrature components can be extracted.

Ideally the ADC should operate as fast as possible so as to maximise the number of samples that can be taken into account (and thereby better averaging out the noise). However, faster ADCs cost more and require faster more expensive clocks. In certain examples, the ADC has a sampling rate at least 80 times the resonant frequency of the resonator, optionally at least 100 times the resonant frequency of the resonator, optionally at least 200 times the resonant frequency of the resonator. Below 50 times the sampling rate, the benefits of the method become less pronounced as other error sources dominate. ADCs are readily available that can operate at over 200 times the resonant frequency of a MEMS resonator resonating at 20 kHz (i.e. sampling rates of 4 million samples per second) without incurring excessive cost.

As discussed above, in some examples, more than one signal component can be extracted (e.g. real and quadrature components can be extracted simultaneously). Therefore in some examples, the method further comprises: generating a second value by combining samples from said stream of samples according to a selected operation, said operation being selected in dependence on said synchronous clock signal; and counting the number of samples contributing to the second value.

The extraction process for the second value may use the same kind of operations as for the first value (e.g. adding, ignoring and subtracting), but may apply those operations with different timing (e.g. applied to different sectors of the resonator cycle).

As discussed above, in some examples the synchronous clock may provide triggers at $\pi/4$, $3\pi/4$, $5\pi/4$ and $7\pi/4$ radians within a single cycle of the resonator's oscillation. One particular benefit of this arrangement is that it can reuse the hardware designs of existing sensors that operate with four samples per cycle, taken at these four sample points, thus redesign and upgrade costs are minimised.

In alternative examples the synchronous clock may provide triggers at $0$, $\pi/2$, $\pi$, and $3\pi/2$ radians within a single cycle of the resonator's oscillation as discussed above.

It will be appreciated that the synchronous clock is preferably synchronous with the real component or the quadrature component of the pickoff signal rather than with the full combined signal (i.e. real plus quadrature components). This ensures that the sectors of the resonant cycle combine or cancel appropriately (as the sectors can be arranged symmetrically with respect to the peaks and zero-crossings of the real and quadrature components). This can be achieved by deriving the synchronous clock from the primary drive circuit of the resonator which does not include the induced quadrature signal and is therefore synchronous with the real part of the signal (whereas the secondary pickoff signal is phase shifted by the presence of the quadrature component).

There are many different ways in which the appropriate operation for combining samples can be selected. For example, a lookup table could be used to store the appropriate operation in association with a particular sector. Each time the synchronous clock indicates a change of sector the lookup table could be consulted to find the appropriate operations to use going forward.

However, in some examples combining samples from said stream of samples comprises multiplying each of said samples by a correlation function, wherein the value of said correlation function is selected in dependence on the synchronous clock signal, adding the result of the multiplication to the first value and wherein counting the number of samples contributing to the first value comprises counting the number of samples for which the correlation function is non-zero. The sign of the correlation function can thus be used to change between addition and subtraction, or can be set to zero where it is desired not to use (i.e. to ignore) certain samples. The product (sample multiplied by correlation function) is then simply always added to the running total to generate the desired value. The correlation function may simply take the normalised values of 0, 1 and −1, i.e. simply identifying the processes of ignoring, adding and subtracting respectively. However, the correlation could alternatively have a scaling factor built in. In some examples, it may be beneficial to apply the scaling factor later in the processing where processing power is more readily available and where resources are not so constrained. Thus the simpler normalised values may allow for faster processing in simpler hardware.

As discussed above, in some examples the first value is generated once for each complete oscillation of the resonator. Such values may be accumulated throughout the cycle and after each such value is generated the corresponding registers may be reset ready for the next cycle.

An alternative to this approach could be to store enough sample values in memory that there is always at least one resonator cycle's worth of stored values available. Values (e.g. real and quadrature component values) could then be generated more frequently based on a previous cycle's worth of sample values. Values could readily be output each time the synchronous clock triggers as these are points in time that clearly align with the resonator position. A full cycle's worth of sample values will contain all relevant sectors of the data. So long as each sample value is stored in association with the operator (or operators) to be used with it (as defined by the sector in which that sample was taken) then the appropriate combination of sample values can be made to generate the desired value(s).

It may even be possible to generate an output more frequently, e.g. updating each time a new sample value is taken. However, there are problems with such an approach. Firstly, the processing power required is greatly increased, but more significantly, the number of samples per resonator cycle is not well-defined. For example both the resonator frequency and the ADC clock may drift due to temperature or other environmental effects, which can change the number of samples per cycle. If such changes are relatively slow then a regularly updated average number of cycles may be used to define a sliding window for more regular updates, or an estimated relative cycle time point could be calculated for (and stored with) each sample after each synchronous clock trigger. However, such processing is likely to be complex and in most cases will not be warranted.

As discussed above a scaling factor may be applied to the generated first value. Similarly, a scaling factor may be applied to the second value if used. Such values depend on the shape of the pickoff signal (e.g. a sinusoid will have a different scaling factor to a saw tooth or square wave) as well as depending on the number of samples taken. For example, it may be desirable to divide the generated value by the number of cycles taken into account in that value. Note that the number of samples taken into account should exclude any samples that were deliberately excluded, e.g. by deliberately ignoring those samples or setting a correlation value to zero. Such scaling may be used to normalise the final values to represent the average value of the demodulated components (e.g. an average value for the real component and/or an average value for the quadrature component) that can be used directly in downstream processing.

There is further disclosed herein a pickoff signal processing system for a MEMS sensor having a vibrating resonator. The system includes: an asynchronous analogue to digital converter arranged to sample a pickoff signal of the resonator at a sampling rate of at least 50 times the resonant frequency of the resonator to generate a stream of samples; and a processor. The processor is arranged to: generate a first value by combining samples from said stream of samples according to a selected operation, said operation being selected in dependence on a synchronous clock signal that is synchronous to the resonant frequency of the resonator, said synchronous clock signal having a frequency at least twice the resonant frequency of the resonator; and count the number of samples contributing to the first value.

The processor may be any suitable processor, e.g. a processor arranged to execute instructions stored in a memory. However, in some examples the processor is a field programmable gate array (FPGA). An FPGA can be arranged to perform simple logic operations very fast and efficiently. The processing of the demodulation methods described herein is particularly well suited to such logic as it can be largely based around simple additions and subtractions without requiring more complex processing. More complex processing, such as application of scaling factors can be applied downstream along with other more computationally intensive processing.

All of the optional features described above in relation to the method may of course also optionally be applied to the pickoff signal processing system. Thus the selected operation may be selected from: i) adding the sample to the first value, ii) ignoring the sample, and iii) subtracting the sample from the first value. The synchronous clock signal may have a frequency at least four times the resonant frequency of the resonator. The ADC may have a sampling rate at least 80 times the resonant frequency of the resonator, optionally at least 100 times the resonant frequency of the resonator, optionally at least 200 times the resonant frequency of the resonator.

The system may be further arranged to: generate a second value by combining samples from said stream of samples according to a selected operation, said operation being selected in dependence on said synchronous clock signal; and count the number of samples contributing to the second value.

The synchronous clock may provide triggers at $\pi/4$, $3\pi/4$, $5\pi/4$ and $7\pi/4$ radians within a single cycle of the resonator's oscillation. Alternatively or additionally the synchronous clock may provide triggers at 0, $\pi/2$, $\pi$, and $3\pi/2$ radians within a single cycle of the resonator's oscillation. Combining samples from said stream of samples may comprise multiplying each of said samples by a correlation function, wherein the value of said correlation function is selected in dependence on the synchronous clock signal, adding the result of the multiplication to the first value and wherein counting the number of samples contributing to the first value comprises counting the number of samples for which the correlation function is non-zero.

The first value may be generated once for each complete oscillation of the resonator. A scaling factor may be applied to the generated first value.

BRIEF DESCRIPTION OF THE DRAWINGS

Certain examples of the disclosure will be described herein, with reference to the accompanying drawings in which.

DETAILED DESCRIPTION

Figure 1:
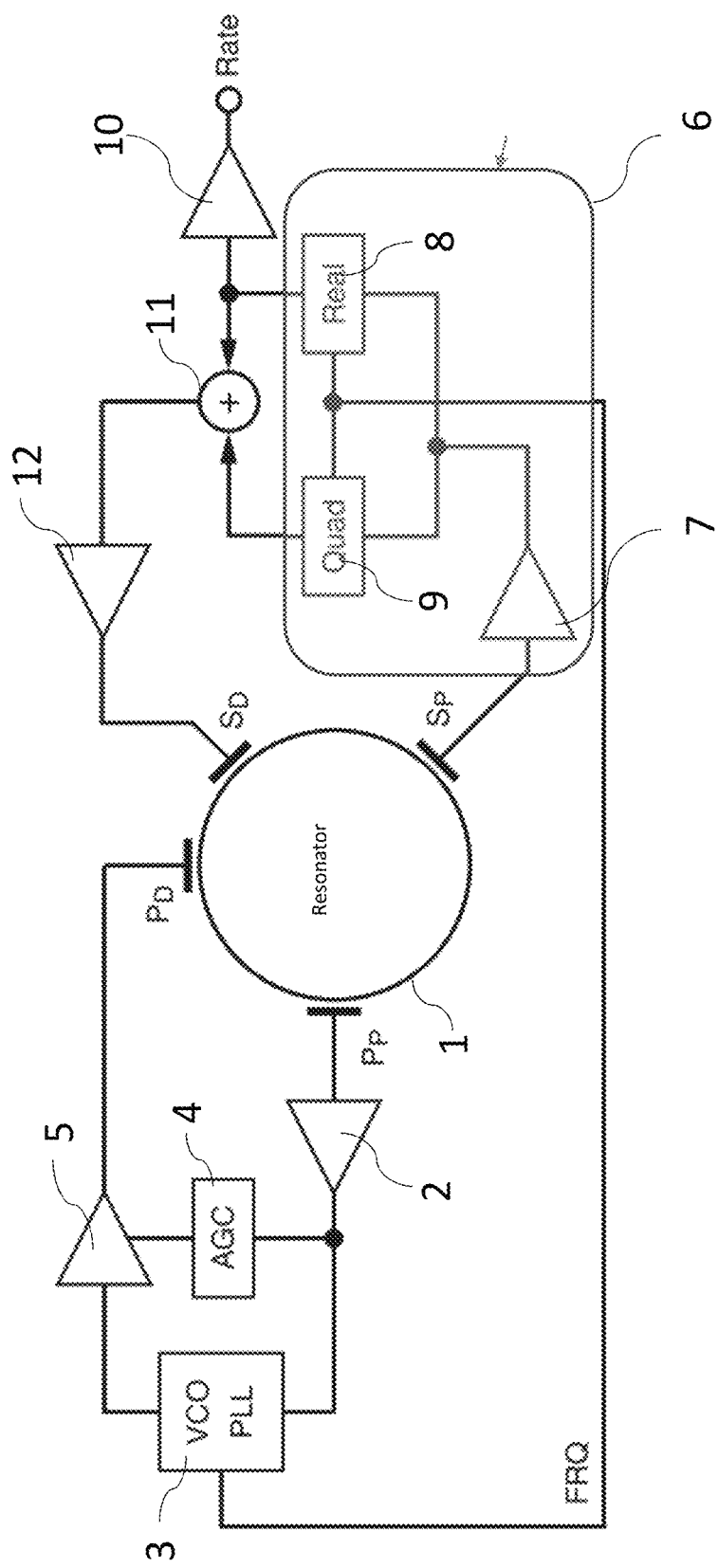
FIG. 1 shows a block diagram of a MEMS gyroscope and associated circuitry.
Figure 2:
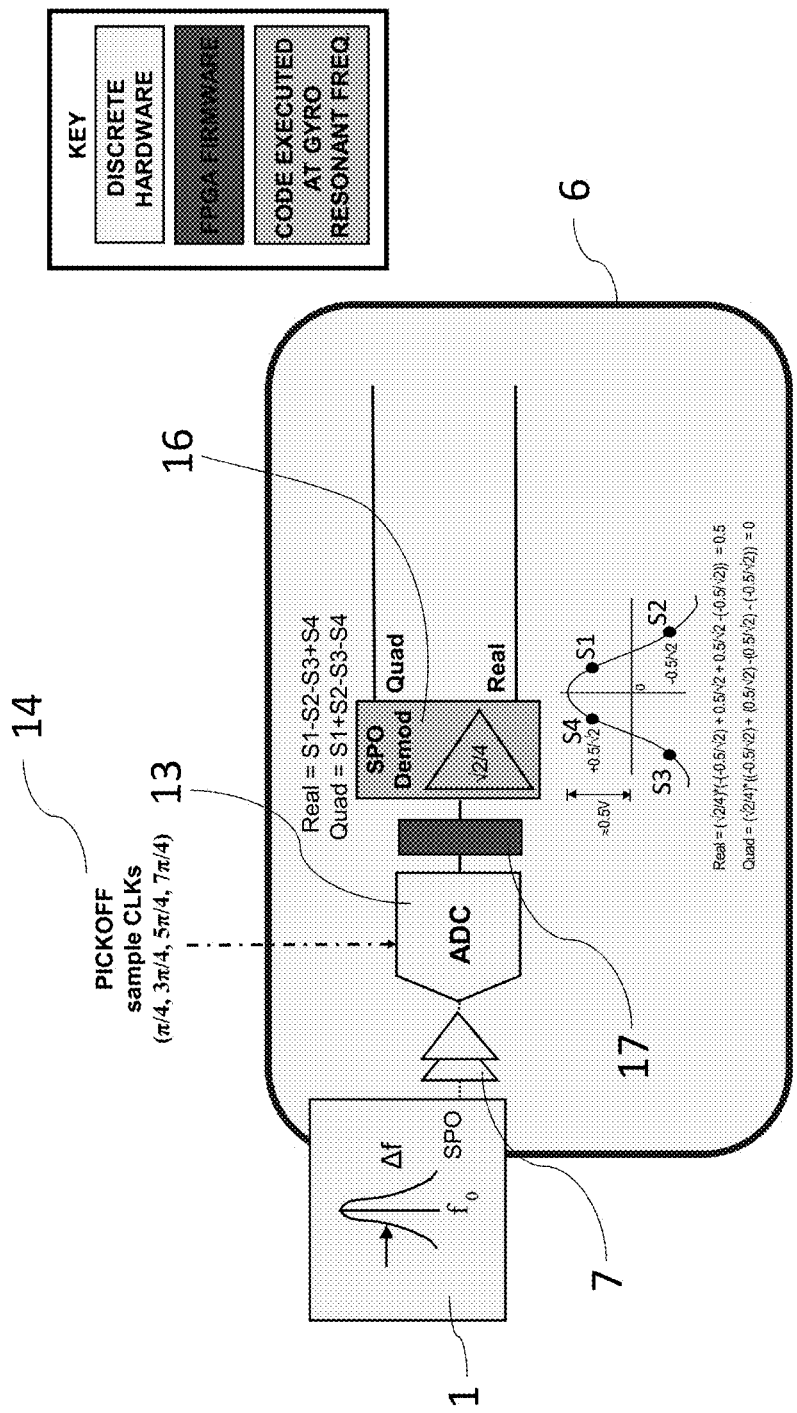
FIG. 2 illustrates the pickoff demodulation process of an existing gyroscope.

FIGS. 1 and 2 were discussed above.

Figure 3:
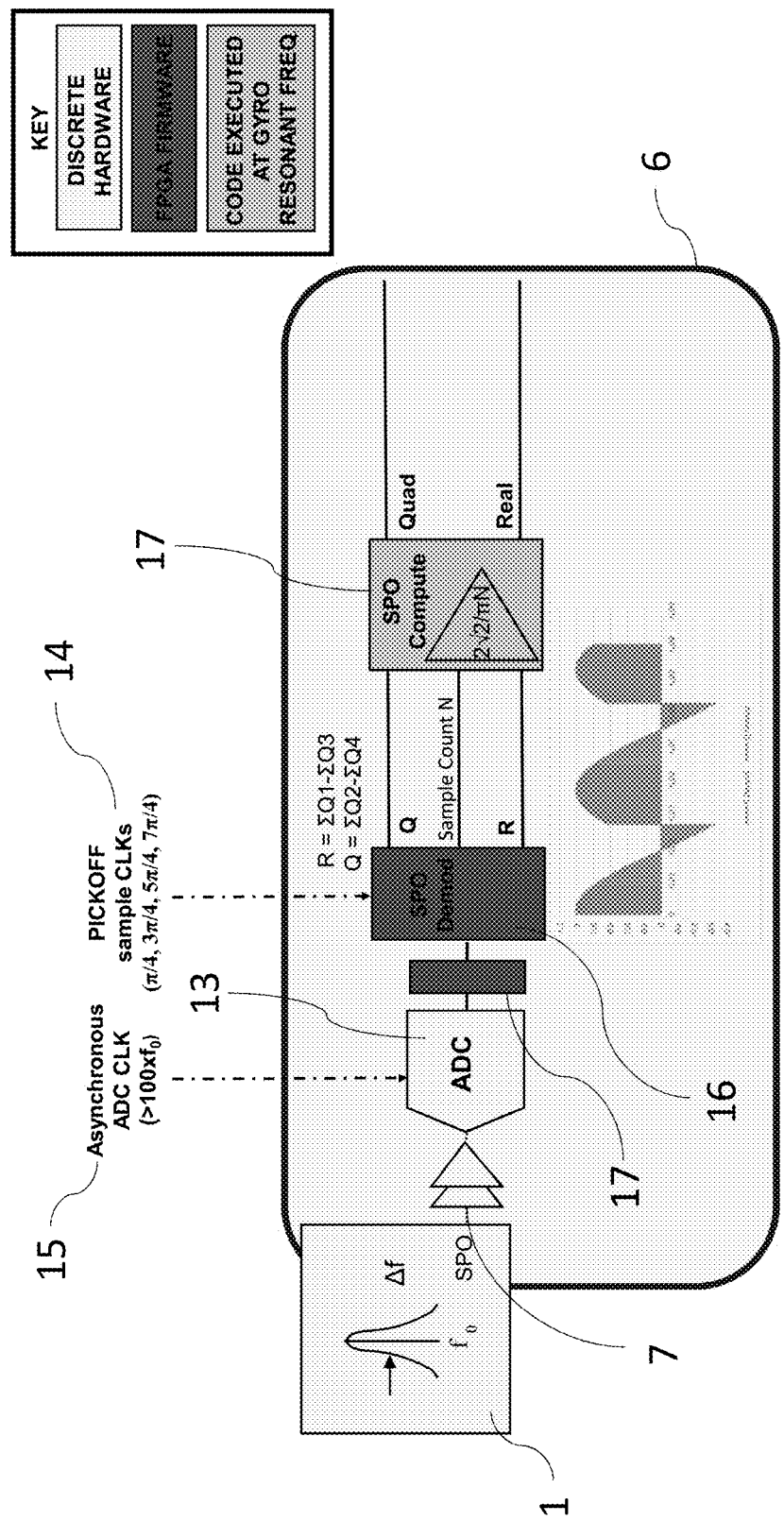
FIG. 3 shows a pickoff demodulation process according to an example of this disclosure.

FIG. 3 is similar to FIG. 2, but shows a pickoff demodulation process according to an example of this disclosure.

The gyroscope used in this example has broadly the same components as illustrated in FIG. 1, but the demodulation process is modified from existing schemes and will be discussed in relation to FIG. 3.

The secondary pick off signal SPO is taken from annular mechanical resonator (e.g. the ring of a ring gyroscope) 1 as before and passed through amplifier 7. The output of amplifier 7 is then passed to ADC 13. However, instead of being driven by the synchronous clock 14 (as in FIG. 2), the ADC 13 of FIG. 3 is an asynchronous ADC driven by an asynchronous clock 15 at a much higher clock frequency. The asynchronous clock 15 can operate at around 100 times the resonant frequency of the resonator 1 (or higher).

Storage block 17 is arranged to receive the samples output from ADC 13 and store them until SPO demodulator 16 is ready to use them. The storage block 17 may be a memory or an array of registers or any other storage mechanism. The storage block 17 essentially acts as a buffer between the high speed ADC 13 operating under the asynchronous clock 15 at a large multiple of the resonant frequency of the resonator 1 and the low speed SPO demodulator 16 operating under the synchronous clock 14 at a small multiple of the resonant frequency of the resonator 1. The storage block 17 could store the individual samples or it could in some examples be an accumulator that adds the samples together until they are read out for processing by SPO demodulator 16.

The SPO demodulator 16 processes the samples from the ADC 13 (via the storage block 17), multiplying each sample by a correlation function that depends on which sector of the resonator cycle it was taken from. This sector (and thus the correlation function) is determined by the synchronous clock 14 which is synchronous with the resonator 1. Thus the correlation function changes at a much slower rate than the sampling rate of the ADC 13. Each sample taken is multiplied by the correlation function and added to a running total stored in the SPO demodulator 16 (or equivalently a stream of samples are first added together and this sum is then multiplied by the correlation function before being added to the running total). Over the course of a complete resonator cycle, the correlation function (which changes in synchrony with the resonator 1) ensures that only a certain component of the SPO signal is consistently added to the running total while other components are cancelled out. For example, by appropriate choice of the correlation function, the real component of the signal can be accumulated while the quadrature component is averaged out. Similarly, by an alternative choice of correlation function, the real component of the signal can be averaged out while the quadrature component is accumulated. Both of these values can be processed simultaneously in the SPO demodulator 16 which thus outputs both values Q and R (being the running total of the accumulated samples multiplied by the appropriate correlation function) together with a sample count N which indicates the number of samples that have been taken during the cycle. In the particular example of FIG. 3, the number of samples taken into account for R and Q is the same and therefore a single count value N is sufficient for both values, but in other examples the demodulator 16 could output a sample count for R and a separate sample count for Q.

A computing module 17 receives the running totals R, Q and sample count N from the SPO demodulator 16 and converts these into actual output values "Quad" and "Real" which have been scaled according to the sample count N and a scaling factor that takes into account the known shape of the waveform of the SPO signal to output values that are appropriately scaled. The computing module 17 can operate at a much lower frequency then the other components as it is only required to output a value of Real and Quad once per resonator cycle in this example (although in other examples it could be arranged to output values more regularly if desired).

The hardware components of this system can take different forms that allow particularly efficient operation. The resonator 1, amplifier 7 and ADC 13 are discrete hardware components operating at high speed (e.g. asynchronous clock speed). The SPO demodulator 16 needs to perform some calculations, but they are simple and can be implemented on an FPGA which is inexpensive and power-efficient. Any more complicated calculations can be performed in the computing module 17 at much lower speed, thus reducing the cost and power consumption further.

Figure 4:
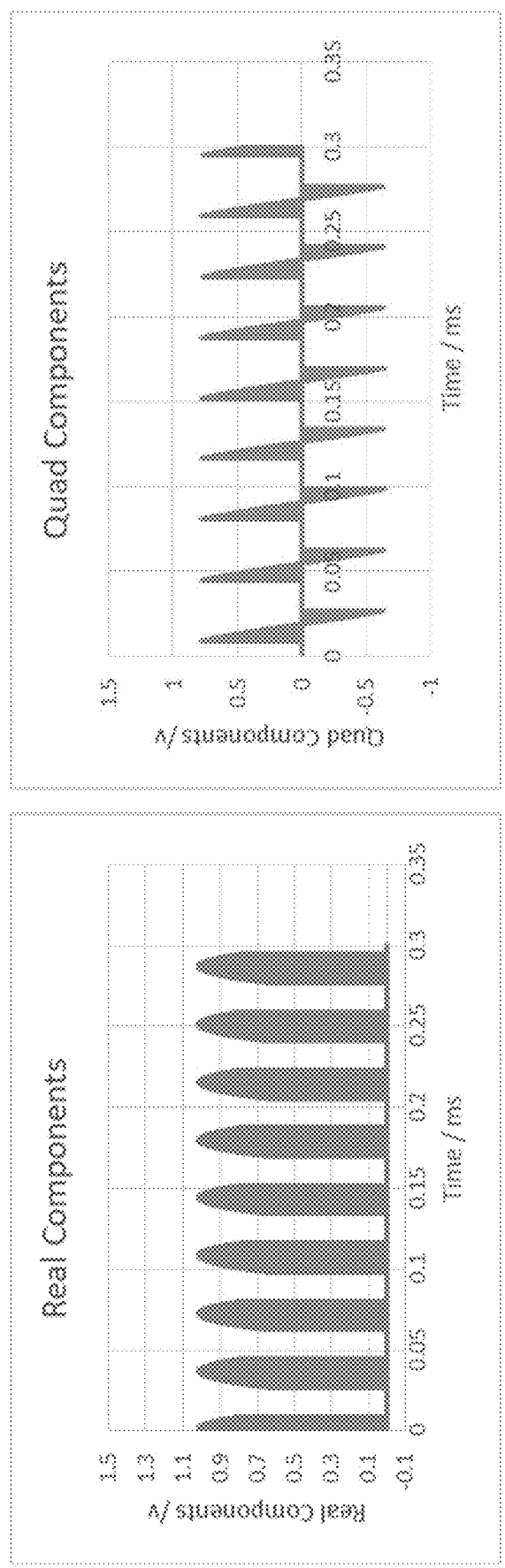
FIG. 4 illustrates one example of dividing samples for use in extracting different signal components.

FIG. 4 shows an example of how the samples taken from the SPO signal can be divided and used to calculate values for the Real and Quad components of the signal. In the left hand graph, the samples used for the Real component are shown. These correspond to samples between $-\pi/4$ and $\pi/4$ and between $3\pi/4$ and $5\pi/4$. Throughout the range of $-\pi/4$ to $\pi/4$ the Real component of the signal (cos $\omega$t) is positive and therefore will add up to a positive contribution. In the same range, the Quad component (sin $\omega$t) is symmetrical and thus averages to a zero contribution. Similarly in the range of $3\pi/4$ to $5\pi/4$ the Real component of the signal (cos $\omega$t) is negative and therefore will add up to a negative contribution. In the same range, the Quad component (sin $\omega$t) is symmetrical and thus averages to a zero contribution. By applying a correlation function to invert the negative contribution of the $3\pi/4$ to $5\pi/4$ so that it is added to the positive contribution of the $-\pi/4$ to $\pi/4$ range, the overall Real contribution is highly positive while the Quad contribution is averaged to zero.

A similar process can be applied using different samples to average the Real contribution to zero while summing the Quad contributions (both positive and inverted negative contributions) to obtain a value for the Quad component of the SPO signal. These samples are shown in the right hand graph of FIG. 4 and are taken in the ranges of π/4 to 3π/4 and 5π/4 to 7π/4.

Figure 5:
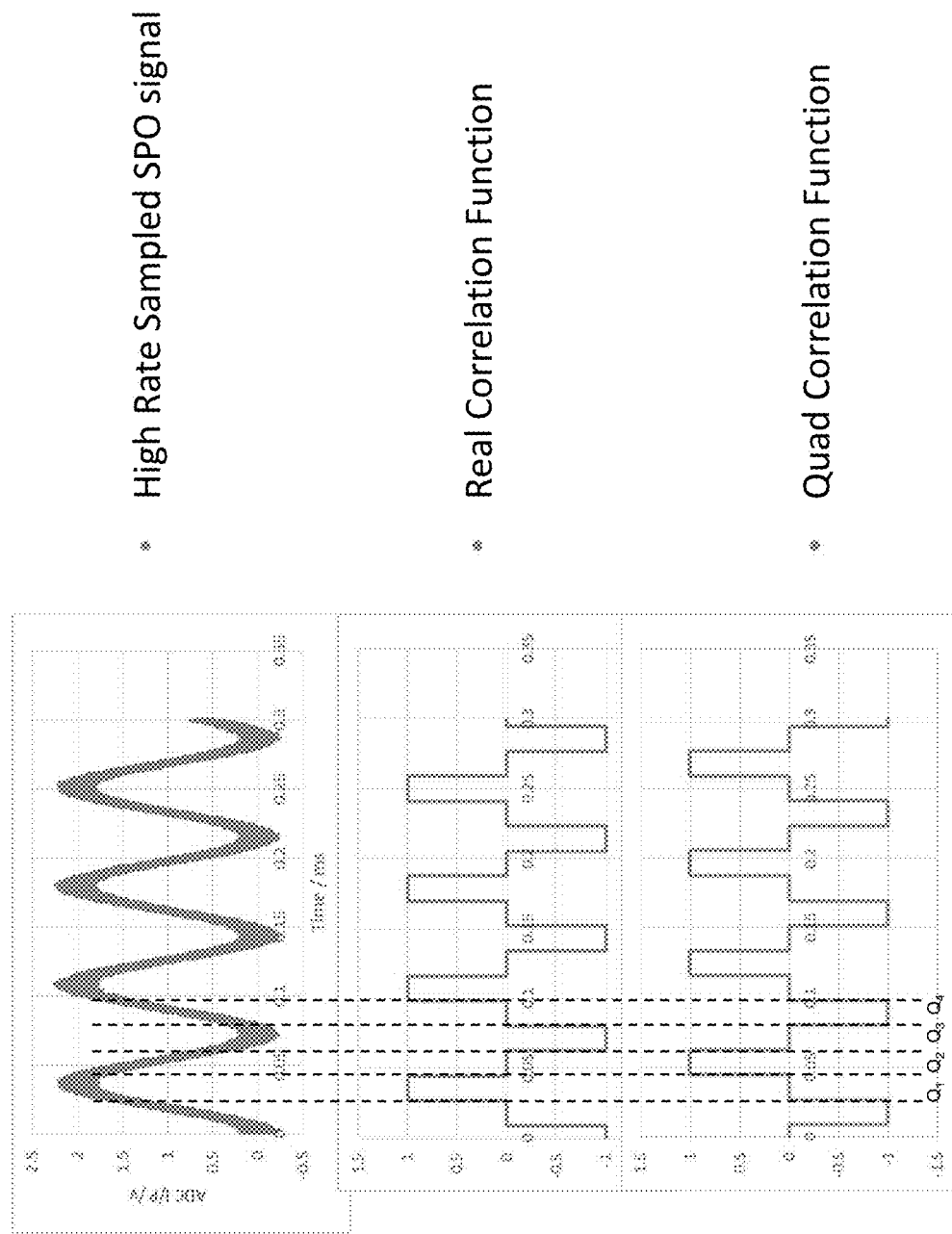
FIG. 5 shows the correlation functions in relation to the actual signal.

The correlation functions are shown in FIG. 5 showing how they match up to the samples of the SPO signal. The uppermost graph shows a noisy SPO signal which is dominated by the Real component, but also has a contribution of Quad that is to be extracted. The middle graph shows the correlation function for the Real component. This correlation function has the value '1' in the range −π/4 to π/4 (thereby adding the positive Real contributions) and the value '−1' in the range 3π/4 to 5π/4 (thereby subtracting the negative Real contributions for an overall positive contribution). The correlation function has the value '0' in the other ranges as those samples are not taken into account in the Real calculation in this example. The lowermost graph shows the correlation function for the Quad component. This correlation function has the value '1' in the range π/4 to 3π/4 (thereby adding the positive Quad contributions) and the value '−1' in the range 5π/4 to 7π/4 (thereby subtracting the negative Quad contributions for an overall positive contribution). The correlation function has the value '0' in the other ranges as those samples are not taken into account in the Quad calculation in this example.

The result of the samples and the correlation functions can be expressed by the following formulae for $S_R$ (Real component) and $S_Q$ (Quad component):

$$S_R = \sum_{-(\frac{\pi}{4})/\omega\Delta t}^{(\frac{\pi}{4})/\omega\Delta t} ADCv_n - \sum_{(\frac{3\pi}{4})/\omega\Delta t}^{(\frac{5\pi}{4})/\omega\Delta t} ADCv_n$$

$$S_Q = \sum_{(\frac{\pi}{4})/\omega\Delta t}^{(\frac{3\pi}{4})/\omega\Delta t} ADCv_n - \sum_{(\frac{5\pi}{4})/\omega\Delta t}^{(\frac{7\pi}{4})/\omega\Delta t} ADCv_n$$

$ADCv_n$ is the value of the sample from the ADC. The sample rate is $1/\Delta t$.

Thus it can be seen that while the summations are done at the asynchronous sample rate (high clock rate), the switch between operations, e.g. from "addition" (first sum term) to "no action" (in between sum terms) and to "subtraction" (second sum term) only occurs at the much lower synchronous clock rate (four times per resonator cycle). These calculations are done in the demodulator 16.

This demodulation scheme defines four quadrants (or sectors) Q1 (−π/4 to π/4), Q2 (π/4 to 3π/4), Q3 (3π/4 to 5π/4) and Q4 (5π/4 to 7π/4).

The values for Real and Quad can be calculated by calculation module 17 by applying a scaling factor to account for the shape of the curve. For the sinusoidal signal expected from a ring gyroscope, this factor can be calculated as the number of samples N multiplied by $2\sqrt{2}/\pi$. Thus:

$$\text{Real} = \frac{S_R}{2N\sqrt{2}/\pi}$$

$$\text{Quad} = \frac{S_Q}{2N\sqrt{2}/\pi}$$

The increased number of samples that can be taken into account in this demodulation scheme provides significant benefits to noise reduction and therefore to signal to noise ratio.

In one example, with an ADC running at 5 MHz (i.e. 5 million samples per second) and with a MEMS gyroscope having a resonant frequency of 14 kHz (i.e. with the asynchronous ADC operating at around 360 times the resonant frequency), the signal to noise ratio was improved by a factor of over ten. This can be calculated in two parts. Firstly, the number of samples taken into account is 180 leading to an attenuation of $1/\sqrt{180}=0.07$. Secondly, the extra samples result in some extra gain, so the average gain over the quadrant is $(2\sqrt{2})/m=1.1$. Therefore the overall signal to noise discrimination is 1:0.08.

In another example, instead of allocating each sample to either the Real calculation or the Quad calculation (each sum being over a quarter wavelength), the samples can be used for both the Real and Quad calculations (with each sum being over a half wavelength). While this requires two calculations per sample, it allows more samples to be taken into consideration in each calculation. In this example the result of the samples and the correlation functions can be expressed by the following formulae for $S_R$ (Real component) and $S_Q$ (Quad component):

$$S_R = \sum_{-(\frac{\pi}{2})/\omega\Delta t}^{(\frac{\pi}{2})/\omega\Delta t} ADCv_n - \sum_{(\frac{\pi}{2})/\omega\Delta t}^{(\frac{3\pi}{2})/\omega\Delta t} ADCv_n$$

$$S_Q = \sum_{0}^{(\pi)/\omega\Delta t} ADCv_n - \sum_{(\pi)/\omega\Delta t}^{(2\pi)/\omega\Delta t} ADCv_n$$

It will of course be appreciated that in these equations the sum limits have been allowed to wrap across the t=0 time point simply for convenience of definitions and that the range from −π/2 to π/2 is of course equivalent to 3π/2 to 5π/2. It will also be appreciated that a different scaling factor will apply in this example due to the different waveform that has been accumulated in the samples. In this example the synchronous clock triggers are at 0, π/2, π and 3π/2.

This demodulation scheme defines four overlapping sectors P1 (−π/2 to π/2), P2 (0 to π) P3 (π/2 to 3π/2) and P4 (π to 2π).

Figure 6A:
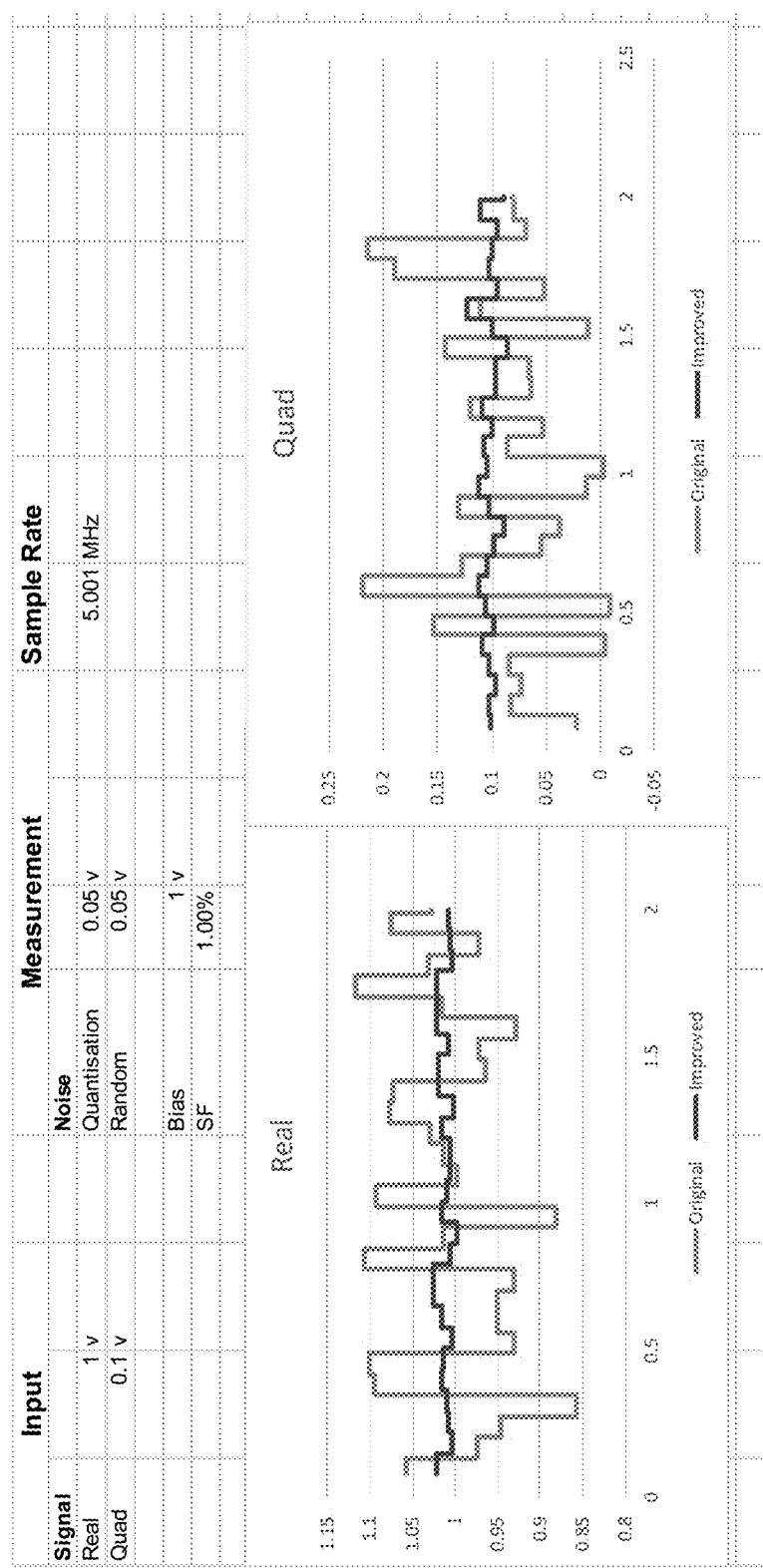
FIGS. 6a and 6b show some simulated results demonstrating the reduction in noise.
Figure 6B:
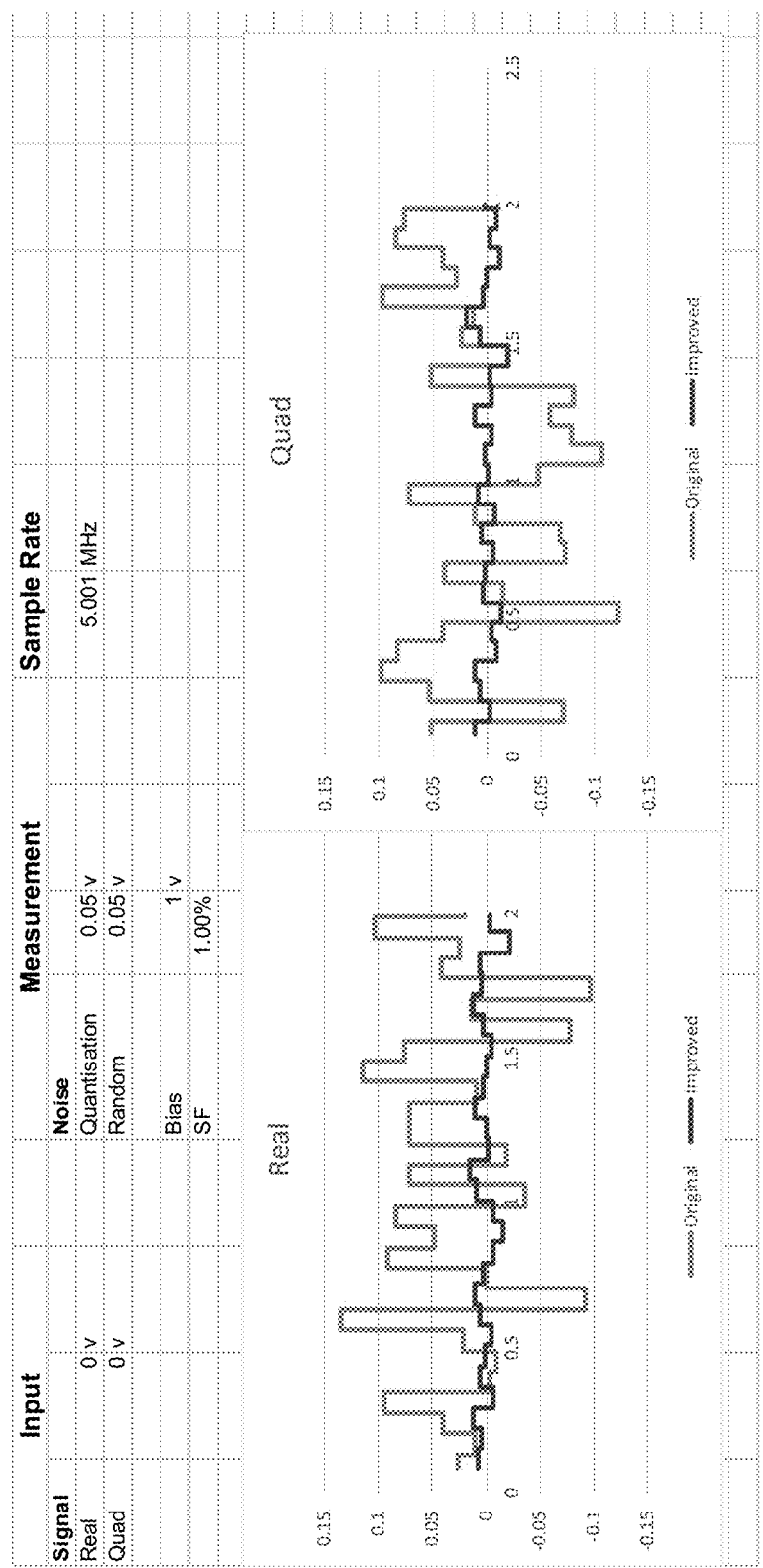

Finally, FIGS. 6a and 6b show the results of some simulations which demonstrate the noise improvement in an quarter wave example as discussed above, i.e. with clock triggers at π/4, 3π/4, 5π/4 and 7π/4. The graphs in FIG. 6a show Real and Quad outputs for a simulation where the Real signal has an amplitude of 1 Volt and the Quad signal has an amplitude of 0.1 V (with random noise added). Each graph shows the calculated output over time for both the demodulation scheme of FIG. 2 (the line labelled "Original") and the demodulation scheme of FIG. 3 and according to this disclosure (the line labelled "Improved"). As can be seen in each graph, the average value for both schemes is at the expected value (1 Volt for Real and 0.1 Volt for Quad), but the variance in the "Improved" line is much lower than that of the "Original" line, demonstrating the large reduction in noise with the scheme according to this disclosure. The pair of graphs in FIG. 6b show the same simulation but with a 0 Volt Real signal (plus noise) and a 0 Volt Quad signal (plus noise). The same effects are evident in that the variance of the "Improved" line is much lower than for the "Original" line.

The invention claimed is:

1. A method of demodulating a MEMS sensor pickoff signal from a vibrating resonator of said MEMS sensor, the method comprising:
sampling the pickoff signal with an asynchronous analogue to digital converter (ADC) at a sampling rate of at least 50 times a resonant frequency of the vibrating resonator to generate a stream of samples, wherein the ADC is asynchronous to the resonant frequency of the vibrating resonator;
generating a first value by combining samples from the stream of samples according to a selected operation, the operation being selected in dependence on a synchronous clock signal that is synchronous to the resonant frequency of the vibrating resonator, the synchronous clock signal having a frequency at least twice the resonant frequency of the vibrating resonator; and
counting a number of samples contributing to the first value.

2. The method as claimed in claim 1, wherein for each sample from the stream of samples the selected operation is selected from:
i) adding the sample to the first value,
ii) ignoring the sample, and
iii) subtracting the sample from the first value.

3. The method as claimed in claim 1, wherein the synchronous clock signal has a frequency at least four times the resonant frequency of the vibrating resonator.

4. The method as claimed in claim 1, wherein the ADC has a sampling rate at least 80 times the resonant frequency of the vibrating resonator.

5. The method as claimed in claim 1, further comprising:
generating a second value by combining samples from said stream of samples according to a selected operation, said operation being selected in dependence on said synchronous clock signal; and
counting a number of samples contributing to the second value.

6. The method as claimed in claim 1, wherein said synchronous clock signal provides triggers at $\pi/4$, $3\pi/4$, $5\pi/4$ and $7\pi/4$ radians within a single oscillation cycle of the vibrating resonator.

7. The method as claimed in claim 1, wherein said synchronous clock signal provides triggers at 0, $\pi/2$, $\pi$, and $3\pi/2$ radians within a single oscillation cycle of the vibrating resonator.

8. The method as claimed in claim 1, wherein:
combining samples from said stream of samples comprises multiplying each of said samples by a correlation function,
wherein a value of said correlation function is selected in dependence on the synchronous clock signal,
adding the result of the multiplication to the first value and wherein counting the number of samples contributing to the first value comprises counting the number of samples for which the correlation function is non-zero.

9. The method as claimed in claim 1, wherein the first value is generated once for each complete oscillation of the vibrating resonator.

10. The method as claimed in claim 1, wherein a scaling factor is applied to the generated first value.

11. A pickoff signal processing system for a MEMS sensor having a vibrating resonator, the system comprising:
an asynchronous analogue to digital converter arranged asynchronous to a resonant frequency of the resonator and arranged to sample a pickoff signal of the vibrating resonator at a sampling rate of at least 50 times a resonant frequency of the vibrating resonator to generate a stream of samples; and
a processor arranged to:
generate a first value by combining samples from said stream of samples according to a selected operation, said operation being selected in dependence on a synchronous clock signal that is synchronous to the resonant frequency of the vibrating resonator, the synchronous clock signal having a frequency at least twice the resonant frequency of the vibrating resonator; and
count a number of samples contributing to the first value.

12. The pickoff signal processing system as claimed in claim 11, wherein the processor is a field programmable gate array.

13. The pickoff signal processing system as claimed in claim 11, wherein for each sample from the stream of samples the selected operation is selected from:
i) adding the sample to the first value,
ii) ignoring the sample, and
iii) subtracting the sample from the first value.

14. The pickoff signal processing system as claimed in claim 11, wherein the synchronous clock signal has a frequency at least four times the resonant frequency of the vibrating resonator.

15. The pickoff signal processing system as claimed in claim 11, wherein the ADC has a sampling rate at least 80 times the resonant frequency of the resonator.

16. The pickoff signal processing system as claimed in claim 11, wherein the ADC has a sampling rate at least 100 times the resonant frequency of the vibrating resonator.

17. A pickoff signal processing system as claimed in claim 11, wherein the ADC has a sampling rate at least 200 times the resonant frequency of the vibrating resonator.

18. A method as claimed in claim 1, wherein the ADC has a sampling rate at least 100 times the resonant frequency of the vibrating resonator.

19. A method as claimed in claim 1, wherein the ADC has a sampling rate at least 200 times the resonant frequency of the vibrating resonator.

* * * * *